Dec. 2, 1958 M. J. CAMPANELLA 2,863,069
TRANSISTOR SWEEP CIRCUIT
Filed Nov. 26, 1954

INVENTOR.
Matthew J. Campanella
BY H. W. Newton
ATTORNEY.

1

2,863,069

TRANSISTOR SWEEP CIRCUIT

Matthew J. Campanella, Hammonton, N. J., assignor to Radio Corporation of America, a corporation of Delaware Application November 26, 1954, Serial No. 471,307

17 Claims. (Cl. 307—88.5)

The present invention generally relates to triggered electronic circuits, and particularly relates to semiconductor signal translating systems for providing a time base or sawtooth signal wave.

In various electronic equipments it is frequently necessary to provide a timing axis or time base in the form of a signal voltage or current of appropriate wave shape. For many applications a sawtooth wave having a substantially linear rise time is appropriate.

A well known type of circuit for developing a sawtooth signal wave is the relaxation type of signal generator wherein a capacitor is charged through one current path of relatively high resistance and discharged through an electronic device thereby providing a sawtooth voltage wave.

This type of circuit, however, does not always provide the required stability of operation and may be difficult to control by the application of timing pulses without extensive complicated circuitry.

It is accordingly an object of the present invention to provide an improved and stable signal translating circuit which efficiently may utilize semiconductor devices for developing a uniform, linear sawtooth signal wave.

It is a further object of the present invention to provide an improved triggered signal translating circuit which may effectively utilize semiconductor devices for developing a uniform, linear sawtooth signal wave.

It is another object of the present invention to provide an improved efficient linear sweep wave generating circuit which may be readily timed by the application of a trigger or control pulse.

It is still another object of the present invention to provide an improved, simple, efficient signal translating system which may be easily triggered by a control or gate pulse to produce or generate a timing signal wave and which is insensitive to variations in the amplitude and repetition rate of the control pulse.

These and other objects of the present invention are accomplished by providing the bias current of the sawtooth generating stage from the output of a pulse operated gate through an inductive element. The application of an input or gate pulse opens the gate and thereby disconnects the bias current source from the sawtooth generator stage. However, the bias current decays exponentially due to the action of the inductor and a unilaterally conducting bias discharge path.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

2

Figure 3:
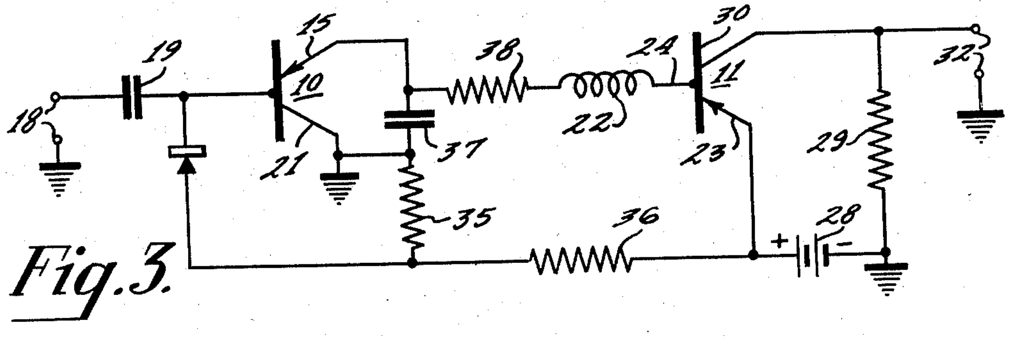
Figure 4:
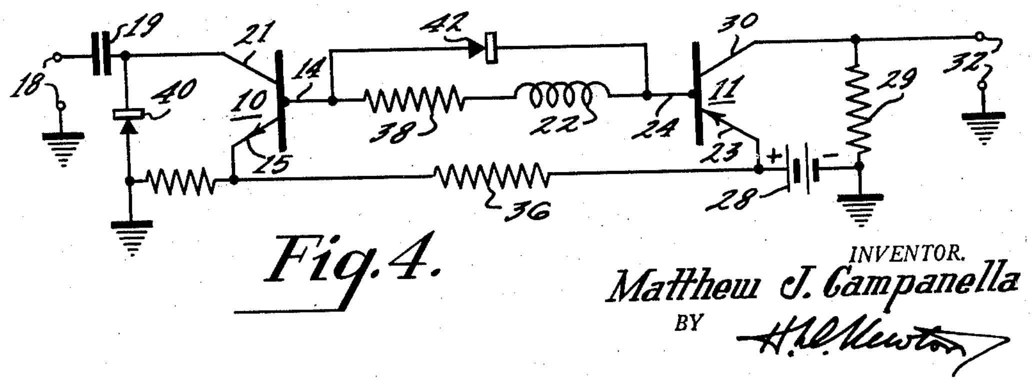

Figure 3 is a schematic circuit diagram of a signal translating circuit utilizing a first semiconductor device in a common collector configuration and a second semiconductor device in a common emitter configuration for generating a sweep signal in accordance with the present invention; and Figure 4 is a schematic circuit diagram of a signal translating system employing a pair of semiconductor devices in the common emitter configuration in accordance with the present invention.

Figure 1:
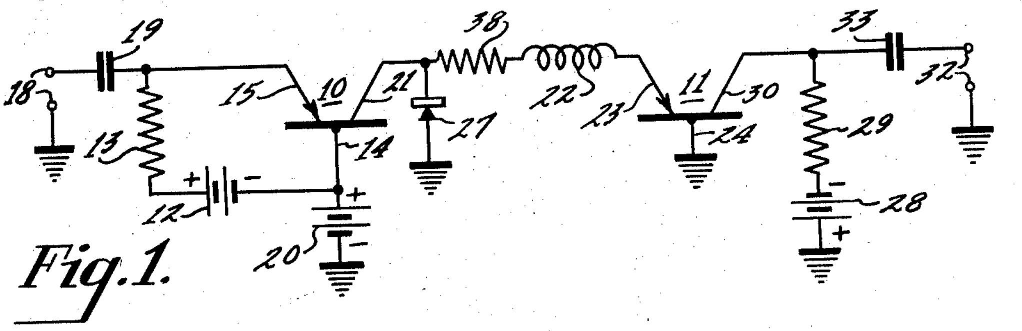
Figure 1 is a schematic circuit diagram of a signal translating system employing a pair of semiconductor devices in a common base configuration in accordance with the present invention for generating a sweep signal.

Referring now to the drawing in which like elements have been designated by the same reference characters throughout the various figures, and referring in particular to Figure 1, a first semiconductor device, illustrated as an N type transistor 10, is utilized as a control bias gate for a second semiconductor device illustrated as an N type transistor 11. The classification of N type transistor includes a point contact device having a body of N type semiconductive material or a DNP junction transistor. It is also to be understood that opposite conductivity types of transistors may be utilized in accordance with the present invention with an appropriate change in the polarity of the applied bias and signals.

The control bias for the gate transistor 10 is provided by a source of direct current bias, illustrated as a battery 12, connected in series with a bias resistor 13 between the base electrode 14 and the emitter electrode 15 of the gate transistor 10. The resistance of the bias resistor 13 and the voltage of the battery 12 are selected to provide a relatively high forward static bias between the base electrode 14 and the emitter electrode 15. Input gate signals having a negative polarity with respect to ground and having a sufficient amplitude to appreciably effect the bias condition of the gate transistor 10 may be applied from any convenient source to a pair of input terminals 18 one of which is coupled with the emitter electrode 15 through a coupling capacitor 19 the other of which is connected directly to a point of fixed reference potential or signal ground.

A second source of direct current bias, illustrated as a battery 20, is connected between the base electrode 14 and signal ground to provide a control bias current for the second transistor 11 and to provide a reverse bias between the collector electrode 21 and the base electrode 14 of the gate transistor 10. As will be more fully discussed hereinafter the gate transistor 10 is effective to control the bias conditions at the input electrodes of the transistor 11. Accordingly, an inductor 22 is connected directly between the emitter electrode 23 of the transistor 11 and the collector electrode 21. The input circuit for the transistor 11 is completed by connecting the base electrode 24 directly to signal ground.

It now may be seen that in a static condition the bias conditions for the transistor 10 are such that the current flowing out of the collector electrode 21 will be of such magnitude to provide a relatively high bias current for the emitter electrode 23. This condition will, at the same time, provide a reverse bias across a diode 27 which is connected directly between the collector electrode 21 and signal ground.

Energizing bias for the output circuit of the sweep wave generator transistor 11 is provided by means of a source of direct current bias, illustrated as a battery 28, connected in series with a direct current conductive load impedance element, illustrated as a resistor 29, between the collector electrode 30 of the transistor 11 and signal ground. Output signals may be derived from a pair of signal output terminals 32 one of which is coupled to the collector electrode 30 by means of a capacitor 33 the other of which is connected directly to signal ground.

As was above discussed the bias conditions for the transistor 11 are such that in a static condition a relatively high current flows out of the collector electrode 30 and through the load resistor 29. The voltage drop appearing across the load resistor 29 is therefore large and the voltage at the collector electrode 30 is only slightly below signal ground. If it is now assumed that a negative going gate pulse is applied to the input terminals 18, the effect of this gate pulse will be to appreciably reduce the conductive ability of the gate transistor 10 or in other words to open the gate. This in effect removes the source of emitter-base current for the transistor 11 from the circuit. It should be apparent, however, that the action of the inductor 22 is such as to prevent a rapid change in the current flowing in the emitter electrode 23.

Under these conditions the diode 27 is biased in such a direction as to provide a short circuit between signal ground and the junction of the collector 21 and the inductor 22. Accordingly, the inductive effect of the inductor 22 is such as to cause the current flowing in the emitter electrode 23 to decay exponentially through the diode 27.

This exponential reduction in the emitter electrode bias current provides a corresponding reduction in the current flowing out of the collector electrode 30. The voltage with respect to ground of the collector electrode 30 will accordingly become more negative. Upon the termination of the gate pulse, the circuit is returned to its state of high current conduction thereby providing a sawtooth signal wave. The time constant provided by the inductor 22, the resistor 38, the diode 27 and the base emitter path of the transistor 11 is chosen to be relatively long compared to the width of the gate pulse to insure pulse control of the circuit.

It is well known to those skilled in the semiconductor art that the family of curves depicting the collector electrode voltage-current characteristics of a semiconductor device exhibit a nonlinearity in that there is crowding in the higher current conducting region. It is also well known, as above mentioned, that the characteristic curve produced by a decay current in an inductor is exponential in character. It may therefore be noted at this time that the effect of the nonlinearity of the collector characteristic curves and the exponential character of the current decay are such as to oppose one another in the circuit provided in accordance with the present invention thereby providing in the output circuit of the transistor 11 a sawtooth voltage wave having a substantially more linear characteristic and which is therefore more useful throughout its entire time duration.

Figure 2:
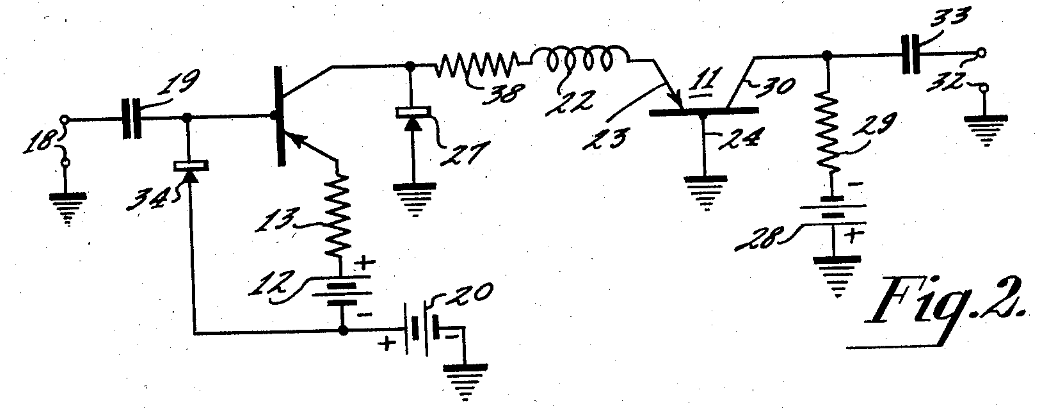
Figure 2 is a schematic circuit diagram of a signal translating system utilizing a first semiconductor device in a common emitter configuration and a second semiconductor device in a common base configuration to develop a sweep or time base signal in accordance with the present invention.

It is also within the scope of the present invention to provide a control bias gate circuit which may be controlled by the application of a positive going gate signal to provide a negative going sawtooth wave as above discussed. Such a circuit is illustrated in Figure 2 wherein the input signal or gate pulse is applied to the base electrode 14 in contrast to being applied to the emitter electrode 15 as illustrated in Figure 1.

The bias conditions existing on each of the transistors 10 and 11 are substantially identical with that described in Figure 1 and accordingly each of the two transistors is in a state of high current conduction in the absence of a gate pulse. A positive going gate pulse applied to the input terminals 18, and hence to the base electrode 14, is effective to reduce the current conducting ability of the transistor 10 so as to provide an exponential emitter current decay as above discussed. It may be noted that the unilaterally conducting device, illustrated as a diode 34, is connected between the base electrode 14 and the junction of the two batteries 12 and 20 in order to allow the capacitor 19 to return rapidly to the static condition upon the termination of the gate pulse.

In the sweep wave generator system illustrated in Figure 3, the first transistor 10 is utilized in a common collector configuration and biased in a static condition to be in a low current conducting condition. The bias is adjusted by means of the two resistors 35 and 36 which are connected in series relation between the positive terminal of the battery 28 and signal ground to provide a current in the collector electrode 15 sufficiently large to establish a base bias current for the transistor 11 such as to bias the transistor 11 in a high current conducting state.

A capacitor 37 is connected directly between signal ground and the emitter electrode 15 to provide a shunt path for the bias currents flowing in the base electrode 24 when an input pulse is applied to the input terminals 18 to effectively cut off the gate transistor 10.

It may now be seen that in a static condition the transistor 10 is conducting sufficiently to provide the required bias for the base electrode 24 as above discussed. The application of a positive going gate pulse to the input terminals 18 is effective to cut off the gate transistor 10, thus effectively open circuiting the base electrode circuit of the transistor 11. The effect of the inductor 22 which is somewhat modified by series resistor 38 is to provide a base bias current for the base electrode 24 which decays at an exponential rate and which flows through the capacitor 37. Accordingly, as above discussed, a sawtooth voltage wave may be derived from the output terminals 32.

In the embodiment of the invention illustrated in Figure 4, the gate transistor 10 is illustrated as a P type semi-conductor device and is provided with a static bias which is opposite to that provided for P type transistor action, that is, the collector electrode 21 is negative and the emitter electrode 15 is positive with respect to the base electrode 14. Accordingly, the collector electrode current flows out of the collector electrode 21 through a unilaterally conducting device illustrated as a diode 40, which is biased in a reverse direction and which is poled to provide a relatively high impedance in the collector electrode circuit thereby maintaining the collector electrode current at a relatively low value.

The bias current for the base electrode 24 is accordingly provided by the current flowing in the base electrode 14 which in a static condition is only of sufficient magnitude to maintain the transistor 11 in a low current conducting state.

The application of a positive going gate pulse to the input terminals 18 will establish the conventional bias conditions between the collector electrode 21 and the emitter electrode 15 such as to provide transistor action in the transistor 10. Accordingly, more base current will be caused to flow into the base electrode 14 and out of the base electrode 24. This will result in an increase in the conductivity of the transistor 11 thereby causing the collector electrode 30 to become more positive with respect to ground. However, the change in the base electrode current is exponential due to the action of the inductor 22 and the resistor 38 which are connected directly between the base electrodes 14 and 24. As above discussed, the effect of this exponential change in the base electrode current and the effect of the nonlinearity of the collector electrode characteristics of the transistor 11 will be such as to provide a substantially linear sawtooth signal output wave across the output terminals 32 which is useful throughout its entire time duration.

A unilaterally conducting device, illustrated as a diode 42, is connected in shunt with the series arrangement of the inductor 22 and the resistor 38 and is poled in such a direction to provide a low impedance discharge path for the inductor 22 when the gate transistor 10 is returned to a cut off condition by the termination of the gate pulse. This, of course, is effective to produce a rapid fall time at the end of each cycle thereby providing a more useful sawtooth wave.

The sweep wave generating system provided in accordance with the present invention is effective to produce a linear sawtooth wave which is useful over the entire time of signal duration with a minimum of circuit elements and while utilizing semiconductor devices of either conductivity type or of both conductivity types simultaneously in a stable efficient circuit configuration.

What is claimed is:

1. A sweep wave signal generating circuit responsive to signal pulses comprising in combination, a first semiconductor device having an input electrode and an output electrode, a control circuit connected with said input electrode, a signal output circuit connected with said output electrode, said device providing an output current which is proportional to current flow in said control circuit, an inductor and a diode connected in series arrangement in said control circuit, said diode being poled to provide a high impedance to current flow in a predetermined direction in said control circuit, a second semiconductor device including three electrodes and having an impedance between two of said three electrodes which is a function of current applied to the third of said three electrodes, means providing a source of direct current bias connected in series with said two electrodes across said unilaterally conducting device, and pulse signal input means connected with said third electrode for applying pulse signals thereto.

2. A signal translating circuit for generating a sawtooth signal wave in response to input signal pulses comprising in combination, a first semiconductor device including a plurality of electrodes and having an output current which is a function of current applied to one of said electrodes, an inductor connected with said one electrode, means including a second semiconductor device and a current source connected in series with said inductor for providing current flow through said inductor and said one electrode, a signal pulse input circuit connected with said second semiconductor device providing a high impedance to current flow through said second semiconductor device in the presence of a signal pulse and a low impedance to current flow in the absence of a signal pulse, and means connected with said inductor providing a discharge path for said inductor in the presence of a signal pulse.

3. A signal translating circuit for generating a sawtooth signal wave in response to input signal pulses comprising in combination, a first semiconductor device including a plurality of electrodes and having an output current which is a function of current applied to one of said electrodes, means including a second semiconductor device and a current source connected in series with said inductor for applying a current to said one electrode, an inductor connected with said one electrode and adapted to be traversed by said applied current, a pulse input circuit connected with said second semiconductor device providing a high impedance current path through said second semiconductor device in the presence of a pulse and a low impedance path in the absence of a pulse, and a diode connected in shunt with said means providing a discharge path for said inductor in the presence of a pulse.

4. A signal translating circuit for generating a sawtooth wave comprising in combination, a first semiconductor device including a plurality of electrodes and having an output current which is a function of current applied to one of said electrodes, an inductor and a resistor connected in series arrangement with said one electrode, current supply means including a second semiconductor device and a current source connected in series with said inductor, a pulse input circuit connected with said second semiconductor device for providing a high impedance current path through said second semiconductor device in the presence of a gate pulse and a low impedance path in the absence of a gate pulse, a first diode connected in shunt with said current supply means for providing a discharge path for said inductor in the presence of a pulse, and a second diode connected in shunt with said input circuit.

5. A transistor sweep signal generator circuit for generating a sawtooth signal wave in response to a signal input pulse comprising in combination, a first semiconductor device having an input, an output and a third electrode, a signal output circuit including a source of direct current bias and a load impedance element coupled with said output electrode, a second semiconductor device including first, second and third electrodes, an inductive element connected between said first electrode and said input electrode, pulse signal input means coupled with said second electrode for providing high current condition in the first electrode of said second device in the absence of a pulse signal and substantially no current condition in the presence of a pulse signal, and a unilaterally conducting device connected between the first and third electrodes of said second device.

6. A transistor sweep signal generator circuit as defined in claim 5, wherein said input, output and third electrodes of said first device and said second, first and third electrodes of said second device are emitter, collector and base electrodes respectively.

7. A transistor sweep signal generator circuit as defined in claim 5, wherein said input, output and third electrodes of said first device are emitter, collector and base electrodes respectively and wherein each of said second, first and third electrodes of said second device are base, collector and emitter electrodes respectively.

8. A transistor sweep signal generating circuit comprising in combination, a first semiconductor device having input, output and third electrodes, a signal output circuit including a first source of direct current bias and a load resistor connected in series arrangement between said output and third electrodes, a second semiconductor device including input, output and third electrodes, an inductor and a damping resistor connected in series arrangement between the output electrode of said second device and the input electrode of said first device, means providing a signal input circuit connected between the input and third electrodes of said second device for gating the output current of said device in response to input signal pulses, a unilaterally conducting device and a second source of direct current bias connected in series arrangement between the output and third electrodes of said second device, and a diode connected in shunt with said input circuit.

9. A transistor sweep signal generating circuit as defined in claim 8, wherein each of said input, output and third electrodes of said first device are emitter, collector and base electrodes respectively and wherein each of said input, output and third electrodes of said second device are base, collector and emitter electrodes respectively.

10. A transistor signal generating circuit for generating a sawtooth signal wave in response to input signal pulses comprising in combination, a first semiconductor device having input, output and third electrodes, means providing a signal output circuit including a first source of direct current bias and a load impedance element connected between said output and third electrodes, a second semiconductor device including input, output and third electrodes, an inductive element connected between the output electrode of said second device and the input electrode of said first device, and a diode and a second source of direct current bias connected in series arrangement between the output and third electrodes of said second device, means for applying input signal pulses to the input electrode of said second device to provide a high impedance current path in the presence of an input signal pulse and a low impedance current path in the absence of an input signal pulse.

11. A transistor sweep signal generating circuit as defined in claim 10, wherein each of said input, output and third electrodes are emitter, collector and base electrodes respectively.

12. A transistor sweep signal generating circuit as defined in claim 10, wherein each of said input, output and third electrodes of said first device are emitter, collector and base electrodes respectively and wherein each of said input, output and third electrodes of said second device are base, collector and emitter electrodes respectively.

13. A transistor sweep signal generating circuit adapted to operate in the presence of a pulse signal comprising in combination; a first and a second semiconductor device, each including input, output and third electrodes; a sweep signal output circuit connected with the output electrode of said first semiconductor device; a source of control bias; an inductor; said source of control bias, said second semiconductor device and said inductor being connected in series in the order named between the third and input electrodes of said first semiconductor device; and an inductive current discharge means connected with said inductor; means providing a gate signal input circuit coupled with the input electrode of said second semiconductor device providing high current condition through said second device in the absence of a signal pulse and substantially no current condition through said device in the presence of a pulse signal.

14. A transistor sweep signal generating circuit as defined in claim 13, wherein said first and second semiconductor devices are of opposite conductivity types and wherein said input, output and third electrodes of said first device are base, collector and emitter electrodes respectively, and wherein said input, output and third electrodes of said second device are collector, base and emitter electrodes respectively.

15. A transistor sweep signal generating circuit as defined in claim 13, wherein each of said devices is of the same conductivity type.

16. A transistor sweep signal generating circuit as defined in claim 15, wherein said input, output and third electrodes are emitter, collector and base electrodes respectively.

17. A transistor sweep signal generating circuit adapted to operate in the presence of a pulse signal comprising in combination, a first and a second semiconductor device, each including input, output and third electrodes, a sweep signal output circuit connected with the output and third electrodes of said first semiconductor device, means for applying a pulse signal to the input electrode of said second semiconductor device, a source of control bias, an inductor, said source of control bias said second semiconductor device and said inductor being connected in the order named between the third and control electrodes of said first semiconductor device, and a unilaterally conducting device connected with said inductor to provide an inductive current discharge path, and means providing high current conduction through said second semi-conductor device in the absence of a pulse signal and substantially no current condition through said device in the presence of a pulse signal.

References Cited in the file of this patent

UNITED STATES PATENTS

| | | |
|---|---|---|
| 2,063,025 | Blumlein | Dec. 8, 1936 |
| 2,595,208 | Bangert | Apr. 29, 1952 |
| 2,614,140 | Kreer, Jr. | Oct. 14, 1952 |
| 2,652,460 | Wallace, Jr. | Sept. 15, 1953 |
| 2,663,800 | Herzog | Dec. 22, 1953 |
| 2,705,287 | Lo | Mar. 29, 1955 |

FOREIGN PATENTS

| | | |
|---|---|---|
| 1,084,478 | France | July 7, 1954 |